United States Patent [19]

Astegher et al.

[11] Patent Number: 5,039,880
[45] Date of Patent: Aug. 13, 1991

[54] FAST SAMPLE AND HOLD CIRCUIT CONFIGURATION

[75] Inventors: Berthold Astegher, Klagenfurt; Alexander Lechner, Faak/See; Hermann Jessner, Villach, all of Austria

[73] Assignee: Siemens Aktiengesellschaft, Munich, Fed. Rep. of Germany

[21] Appl. No.: 513,927

[22] Filed: Apr. 24, 1990

[30] Foreign Application Priority Data

Apr. 24, 1989 [EP] European Pat. Off. ........ 89107376.9

[51] Int. Cl.$^5$ ............................................. G11C 27/02
[52] U.S. Cl. .................................... 307/353; 307/494
[58] Field of Search ................. 307/353, 490, 493, 494

[56] References Cited

U.S. PATENT DOCUMENTS

| | | |
|---|---|---|
| 3,452,289 | 6/1969 | Ryan . |
| 3,474,259 | 10/1969 | Rodgers . |
| 3,643,110 | 2/1972 | Thompson . |
| 4,370,572 | 1/1983 | Cosand et al. ................. 307/353 |
| 4,873,457 | 10/1989 | Sanielevici ..................... 307/353 |

FOREIGN PATENT DOCUMENTS 0144759 6/1985 European Pat. Off. .
3236728 4/1984 Fed. Rep. of Germany .

OTHER PUBLICATIONS

IEEE Journal of Solid-State Circuits, Feb. 1970, pp. 45-48, Ryan: "Applications of a Four-Quadrant Multiplier".

Primary Examiner—John Zazworsky
Attorney, Agent, or Firm—Lerner: Herbert L.; Laurence A. Greenberg

[57] ABSTRACT

A sample and hold circuit configuration for differential signals with reduced holding capacity includes an amplifier in which the same current ratios prevail in the collector circuit and in the emitter circuit. The base currents are discharged through additional transistors and therefore the same currents flow and equal voltage ratios prevail in the collector and emitter resistors, and an additional diode is connected in each collector circuit.

5 Claims, 4 Drawing Sheets

PRIOR ART

FIG 4

PRIOR ART

FAST SAMPLE AND HOLD CIRCUIT CONFIGURATION

The invention relates to a circuit configuration including a symmetrically constructed sample and hold amplifier including first, second, third and fourth transistors each having a collector, a control terminal, an emitter and an emitter circuit, the collectors of the first and the third transistors being interconnected to form a first output terminal, the collectors of the second and the fourth transistors being interconnected to form a second output terminal, a first collector resistor connected between the first output terminal and a first supply potential, a second collector resistor connected between the second output terminal and the first supply potential, the first output terminal being connected to the control terminal of the fourth transistor, the second output terminal being connected to the control terminal of the third transistor, the control terminal of the first transistor forms a first input terminal of the sample and hold amplifier to be acted upon by a differential signal, the control terminal of the second transistor forms a second input terminal of the sample and hold amplifier to be acted upon by a differential signal, a hold capacitor connected between the first and second output terminals, at least one other resistor connected between the emitters of the first and second transistors, at least one further resistor connected between the emitters of the third and fourth transistors, a fifth transistor having a control terminal and an emitter and having a collector connected to the emitter circuits of the first and second transistors, a sixth transistor having a control terminal and an emitter and having a collector connected to the emitter circuits of the third and fourth transistors, and constant current impressing means connected between the emitters of the fifth and sixth transistors and a second supply potential, the control terminals of the fifth and sixth transistors being acted upon by a signal causing the fifth and sixth transistors to alternatingly conduct current and block.

Sample and hold, or track and hold, circuits are needed above all for analog/digital converters, in order to keep the input voltage constant for the duration of the process of converting an analog input voltage to a digital output word and thus to preclude errors. A sample and hold circuit (S/H) accordingly samples an analog voltage signal at predetermined times and keeps the instantaneous voltage value constant in analog form during the hold phase.

A publication by Tanaka et al entitled "A 40 MS/s Monolithic S/H IC", ISSCC 83, page 190, discloses a sample and hold circuit, the principle of which is shown and more fully described below in the description of the figures. Faster sample and hold amplifiers require expensive circuits with field effect and bipolar transistors of both conduction types and are virtually unknown in a monolithically integrated form. The integrated circuit according to the aforementioned publication operates at a sampling frequency of up to 40 MHz.

During the hold phase in sample and hold circuits, the problem which arises is that the voltage, which is held by a capacitor, is sensed with the aid of an amplifier, and during that process, charges flow out through the terminal input resistor of the amplifier, causing a drop in the voltage applied through the capacitor. In order to assure malfunction-free operation, a capacitor that must not be overly small and thus limit the operating speed of the sample and hold circuit is accordingly needed as the hold capacitor.

Figure 2:
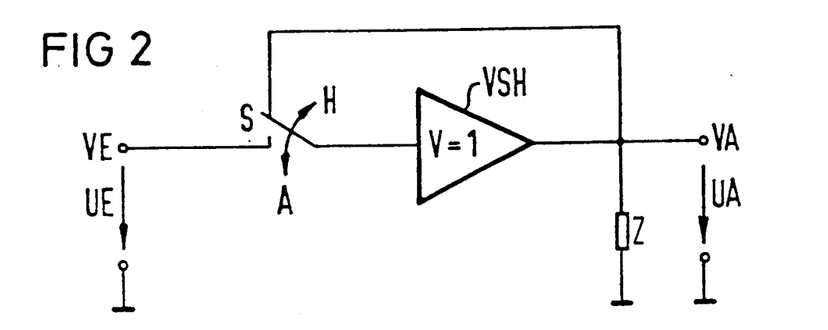
FIG. 2 is a circuit diagram of a known sample and hold circuit of the kind which is important to circuits according to the invention.

An article by C. R. Ryan, entitled "Applications of a Four-Quadrant Multiplier", IEEE Journal of Solid-State Circuits, February 1970, pp. 45-48 discloses a sample and hold circuit in which the amplification deviations of a regenerative amplifier affects the hold time. FIG. 2 shows such a known circuit having a signal input, a control input and a feedback circuit.

U.S. Pat. No. 3,452,289 discloses a signal processing unit that is more fully described below in the description of the figures.

In such known circuits, toggling between the sample phase and the hold phase is carried out by providing that the current in the various current paths of the sample and hold amplifier circuit is toggled. In other words, the current through the current path activated in the sample phase is switched off, and the current through the other current path, the one activated in the hold phase, is switched on. As will be described again below, it is particularly important in such circuits that the amplification factor of the sample and hold amplifier be as constant as possible and equal to one to the extent possible.

It is accordingly an object of the invention to provide a fast sample and hold circuit configuration for processing differential signals, which overcomes the hereinaforementioned disadvantages of the heretofore-known devices of this general type, and in which a amplification factor of one can be set.

With the foregoing and other objects in view there is provided, in accordance with the invention, a circuit configuration, comprising a symmetrically constructed sample and hold amplifier including first, second, third and fourth transistors each having a collector, a control terminal, an emitter and an emitter circuit, the collectors of the first and the third transistors being interconnected to form a first output terminal, the collectors of the second and the fourth transistors being interconnected to form a second output terminal, a first collector resistor connected between the first output terminal and a first supply potential, a second collector resistor connected between the second output terminal and the first supply potential, the first output terminal being connected to the control terminal of the fourth transistor, the second output terminal being connected to the control terminal of the third transistor, the control terminal of the first transistor forms a first input terminal of the sample and hold amplifier to be acted upon by a differential signal, the control terminal of the second transistor forms a second input terminal of the sample and hold amplifier to be acted upon by a differential signal, a hold capacitor connected between the first and second output terminals, a fifth transistor having a control terminal, an emitter and a collector, other resistors each being connected between the control terminal of the fifth transistor and the emitter circuit of a respective one of the first and second transistors, a sixth transistor having a control terminal, an emitter and a collector, further resistor each being connected between the control terminal of the sixth transistor and the emitter circuit of a respective one of the third and fourth transistors, constant current impressing means connected between the emitters of the fifth and sixth transistors and a second supply potential, the control terminals of the fifth and sixth transistors being acted upon by a signal causing the fifth and sixth transistors to alternatingly conduct current and block, a seventh transistor having a collector and an emitter and having a control terminal connected to the emitter of the first transistor, an eighth transistor having a collector and an emitter and having a control terminal connected to the emitter of the second transistor, a ninth transistor having a collector and an emitter and having a control terminal connected to the emitter of the third transistor, a tenth transistor having a collector and an emitter and having a control terminal connected to the emitter of the fourth transistor, eleventh and twelfth transistors each having a collector, an emitter and a control terminal, added resistors each being connected between the collector of the eleventh transistor and the emitter of a respective one of the seventh and eighth transistors, additional resistors each being connected between the collector of the twelfth transistor and the emitter of a respective one of the ninth and tenth transistors, further constant current impressing means connected between the emitters of the eleventh and twelfth transistors and the second supply potential, the control terminal of the eleventh transistor being connected to the control terminal of the fifth transistor, the control terminal of the twelfth transistor being connected to the control terminal of the sixth transistor, and supplemental resistors each being connected between the collectors of a respective one of the seventh, eighth, ninth and tenth transistors and the first supply potential.

In accordance with another feature of the invention, there are provided diodes, which may be referred to as first diodes, connected in the conducting direction, each of the diodes being connected in series with a respective one of the first and second collector resistors between the first supply potential and a respective one of the output terminals.

In accordance with a further feature of the invention, there are provided diodes, which may be referred to as second diodes, each being connected in the conducting direction between the first supply potential and the collector of a respective one of the seventh, eighth, ninth and tenth transistors.

In accordance with a concomitant feature of the invention, each of the diodes is a respective transistor having an emitter, a collector and a control terminal, the control terminal and the collector of each of the transistors of the first diodes being connected together to the first supply potential; the control terminals of the transistors of the second diodes connected to the collectors of the eighth and ninth transistors are connected to the emitter of the transistor of the first diode connected to the second collector resistor; and the control terminals of the transistors of the second diodes connected to the collectors of the seventh and tenth transistors are connected to the emitter of the transistor of the first diode connected to the first collector resistor.

An advantage of the circuit configuration according to the invention is that metastable states of the amplifier are utilized for storing the sampled analog voltage in memory, so that in the ideal case the circuit configuration can be operated without a further stabilization network.

Other features which are considered as characteristic for the invention are set forth in the appended claims.

Although the invention is illustrated and described herein as embodied in a fast sample and hold circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
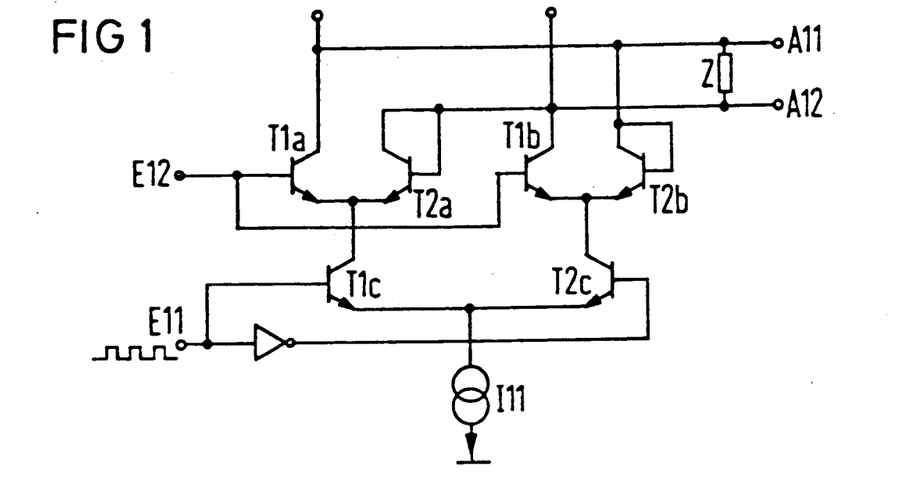
FIG. 1 is a schematic circuit diagram of a known sample and hold circuit.

Referring now in detail to the figures of the drawing in which identical elements are identified by the same reference numerals and in which the basic principle of the sample and hold circuits used in circuits according to the invention is first addressed in terms of exemplary embodiments shown in FIGS. 1-6, and first, particularly, to FIG. 1 thereof, there is seen a first differential amplifier having first and second semiconductor components $T1c$, $T2c$ in the form of transistors with interconnected emitters. Each of these semiconductor elements has a control input for receiving a first input signal $E11$ and a collector terminal.

A second differential amplifier is formed of third and fourth semiconductor components $T1a$, $T2a$ in the form of transistors and a third differential amplifier is formed of fifth and sixth semiconductor components $T1b$, $T2b$ in the form of transistors. Each semiconductor component of the second and third differential amplifiers has a collector, a control input and an emitter. The emitter terminals of the transistors in the second differential amplifier are connected to each other and to the collector of the first semiconductor component $T1c$, and the emitter terminals of the transistors in the third differential amplifier are connected to each other and to the collector of the second semiconductor component $T2c$. The control inputs of the third and fifth semiconductor components $T1a$, $T1b$ are interconnected to receive a second input signal, the collector terminals of the third and sixth semiconductor components $T1a$, $T2b$ are interconnected and form a first output terminal $A11$, the collector terminals of the fourth and fifth semiconductor components $T2a$, $T1b$ are likewise interconnected and form a second output terminal $A12$, the first output terminal $A11$ is connected through switching means Z to the second output terminal $A12$, the first output terminal $A11$ is connected to the control input of the sixth semiconductor component $T2b$, the second output terminal $A12$ is connected to the control input of the fourth semiconductor component $T2a$, and the control inputs of the first and second semiconductor components $T1c$, $T2c$ are acted upon by the first input signal $E11$ in such a manner that these two semiconductor components alternatingly conduct a current or are blocked.

In the sample and hold circuit according to FIG. 2, a complex stabilization network Z, which in the simplest case may be in the form of a capacitor, is connected through a switch S to an input terminal VE is loaded with a voltage that is proportional to or equal to an input voltage UE when the switch is in a closed position in a sampling phase A. During a hold phase, when the switch S is in a position H, the voltage at the capacitor is sampled with high impedance with the aid of an amplifier VSH and is available as an output voltage UA at an output terminal VA of the amplifier, referred to a reference terminal.

The switch S must be capable of switching over from as low-impedance a state during the sampling phase A to as high-impedance a state as possible during the hold phase H in order to be capable of quickly reloading the capacitor, so as not to influence the voltage value stored in memory with the aid of the capacitor. Versions of sample and hold circuits operate in the frequency range of up to approximately 10 MHz with field effect transistors.

The circuit configuration according to FIG. 2 utilizes metastable states of the amplifier VSH, in order to keep an analog input voltage UE, which is sampled with the aid of the switch S, constant for a predetermined period of time or during the hold phase H. The switch S is only located on the input side of the amplifier VSH, the amplification V of which must be exactly 1. During the hold phase H, the amplifier output or the output terminal VA is fed back through the switch S directly to the amplifier input.

In the exemplary embodiment of FIG. 2, the complex stabilization network Z, which in the simplest case may be in the form of a capacitor as mentioned above, is connected between the output terminal VA and the reference terminal, which is not identified by reference numeral. Under ideal conditions for the sample and hold circuit configuration, the complex stabilization network Z can be omitted, without any change in the output voltage UA in the hold phase. Taking into account actual physical conditions, an offset $\Delta u$ and a deviation of the amplification V from the ideal value 1 by a value $\Delta v$ must be taken into account for the amplifier VSH.

Figure 3:
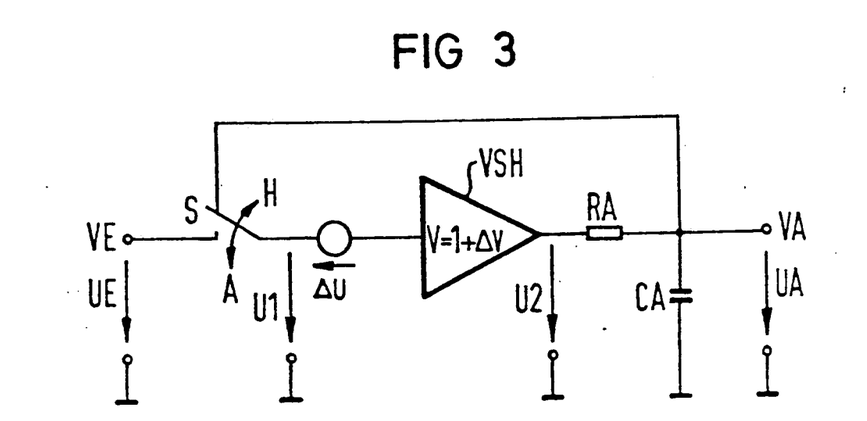
FIG. 3 is a substitute circuit diagram for a sample and hold circuit configuration of FIG. 2, taking physical disturbance variables into account.

FIG. 3 shows a physical substitute circuit diagram of the real sample and hold circuit configuration of FIG. 2. The offset of the amplifier VSH is shown in the form of a voltage source with the voltage $\Delta u$ between the switch S and the input of the amplifier VSH.

The amplification V of the amplifier VSH in FIG. 3 then amounts to $1+\Delta v$. The real output resistance of the amplifier VSH, which differs from 0, is shown as a resistor RA between the output of the amplifier and the output terminal VA.

In the exemplary embodiment of FIG. 3, a stabilizing capacitor CA is provided as the stabilizing network Z between the output terminal VA of the circuit configuration and the reference potential. Corresponding to FIG. 2, the output terminal VA is connected to the switch S and thus fed back to the amplifier input during the hold phase H.

During the sampling phase, on the assumption that the disturbance variables $\Delta u$ and $\Delta v$ are equal to 0, the 3 dB threshold circuit frequency is equal to the reciprocal product of the output resistor RA and the capacitor CA.

The behavior of the circuit configuration of FIG. 3 during the hold phase, and in particular the duration of the metastable states, can be calculated by the following formula, with the voltage U1 taken from the amplifier-side terminal of the switch S and the voltage U2 taken between the amplifier VSH and the output resistor RA, in each case being referred to a terminal having reference potential:

$$U2 = (U1 + \Delta u) \cdot (1 + \Delta v)$$

$$\frac{dUA}{dt} = \frac{1}{CA} \cdot i_C(t) = \frac{U2(t) - UA(t)}{RA \cdot CA}$$

$$U1 = UA$$

The result is the following differential equation:

$$\frac{dUA}{dt} - \frac{\Delta v}{RA \cdot CA} \cdot UA = \frac{\Delta u}{RA \cdot CA} \cdot (1 + \Delta v).$$

The general solution of the differential equation is as follows:

$$UA(t) = \left( UAo + \Delta u \cdot \frac{1 + \Delta v}{\Delta v} \right) \cdot \exp\left( \frac{\Delta v \cdot t}{RA \cdot CA} \right) - \Delta u \frac{1 + \Delta v}{\Delta v}$$

where UAo is the voltage value at the beginning of the hold phase.

Simplified versions of the general solution to the differential equation exist for the special cases in which one of the disturbance variables $\Delta u$ or $\Delta v$ at a time are equal to 0. If $\Delta u = 0$, then the following is obtained:

$$UA(t) = UAo \cdot \exp\left( \frac{\Delta v \cdot t}{RA \cdot CA} \right)$$

and for the special case of $\Delta v = 0$, $$UA(t) = UAo + \frac{\Delta u \cdot t}{RA \cdot CA}$$

It can be seen from the simplified solutions to the differential equation that as the disturbance variables $\Delta u$ and $\Delta v$ become larger, the metastable state of the sample and hold circuit configuration is left behind faster. In the case of $\Delta u = 0$, an exponential variation in the output voltage UA occurs with increasing time t, while in the case of $\Delta v = 0$, an additive term that increases linearly with time is added to the voltage value at the beginning of the sampling phase.

Figure 4:
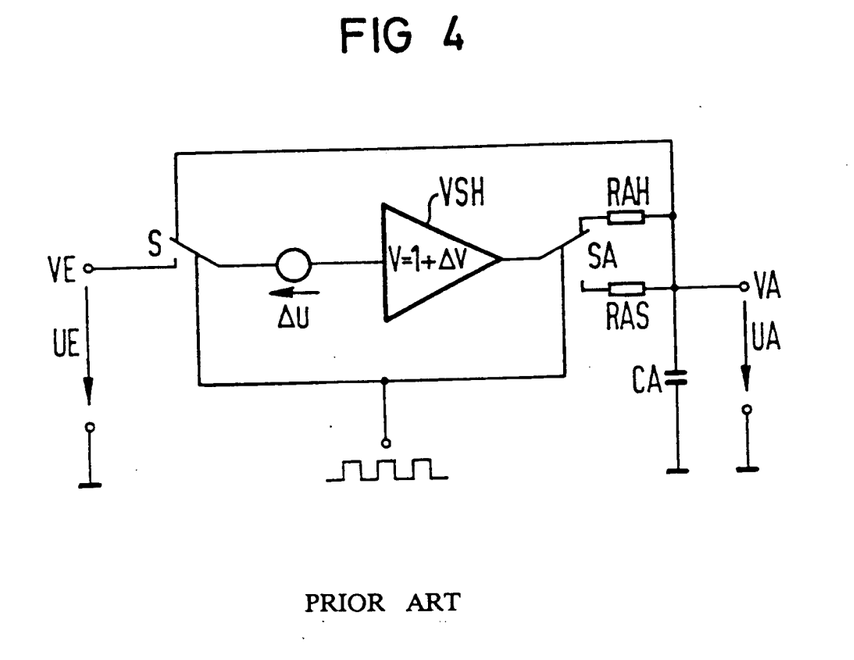
FIG. 4 is a diagram of a sample and hold circuit configuration of FIG. 3 with output time constants that can be toggled.

In the exemplary embodiment of FIG. 4, an additional switch SA is provided at the output of the amplifier VSH. Depending on its position, the additional switch switches an output resistor RAH or an output resistor RAS into the signal path, with RAH being selected to be greater than RAS. This makes the output time constant RAH · CA for the hold phase larger than that for the sampling phase.

Figure 5:
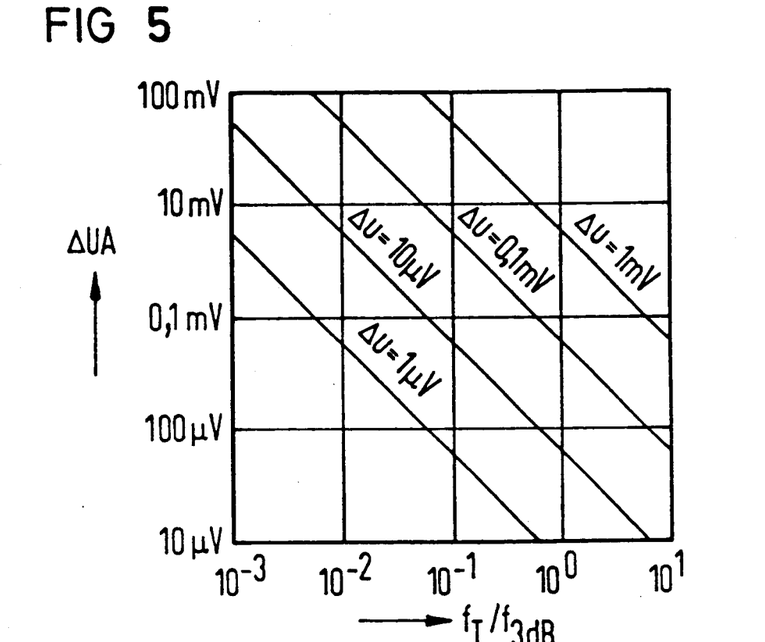
FIGS. 5 and 6 are two diagrams for estimating the requirements for accuracy for a sample and hold circuit configuration.
Figure 6:
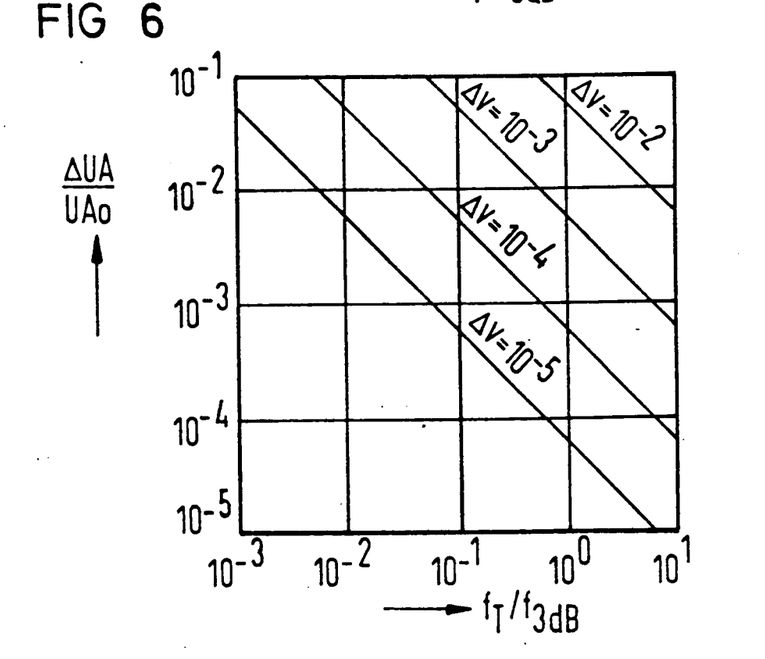

The accuracy requirements to be made of a sample and hold circuit configuration according to the invention are shown in the diagrams of FIGS. 5 and 6. In both diagrams, the abscissa shows the sampling frequency $f_T$ referred to the 3 dB threshold frequency. FIG. 5 shows the variation $\Delta UA$ of the output voltage on the ordinate as a difference between the value UAo of the output voltage at the beginning of the hold phase and the voltage value UA(T) after the time (T), which is equal to the inverse sampling frequency $f_T$.

As parameters, decadically different values for the disturbance variable $\Delta u$ are plotted in FIG. 5. FIG. 6 has the above-defined variation $\Delta UA$ of the output voltage plotted on the ordinate as a relative variable, referred to the value UAo of the output voltage at the beginning of the hold phase, and as parameters it has various decadically stepped values for the disturbance variable $\Delta v$ in the deviation of the amplification factor of the amplifier VSH from the ideal value of 1.

It can be seen from FIGS. 5 and 6 that with disturbance variables $\Delta u$ and $\Delta v$, which can be attained with highly precise monolithically integrated amplifiers, at a sampling frequency of $f_T$ which is approximately equivalent to the 3 dB threshold frequency, or in other words about the abscissa value of $10^0$, high accuracy of the sample and hold circuit configuration according to the invention can still be attained. The attainable accuracy can be even further increased by selecting different time constants for the sampling and hold phases in accordance with the embodiment of the circuit shown in FIG. 4. Thus this kind of sample and hold circuit configuration according to the invention has the advantage of even being suitable for use in monolithic analog/digital converters that are operated near the Nyquist frequency.

If the amplification factor of a sample and hold amplifier according to the invention is 1, as accurately as possible, then as can be inferred from the above explanations, such a circuit can make do with a small hold capacity Ch, which leads to a very high processing frequency.

Such an amplifier is attained by providing the same current and voltage behavior in both the collector circuit and the emitter circuit.

Figure 7:
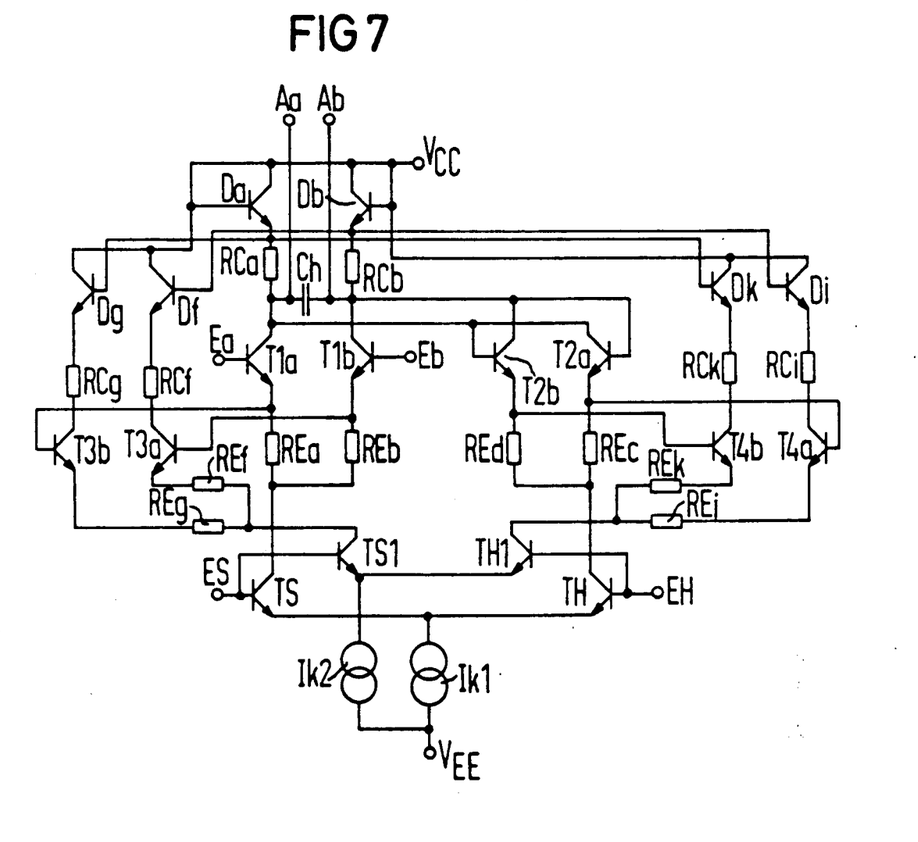
FIG. 7 is a diagram of a sample and hold circuit configuration according to the invention.

FIG. 7 shows a circuit configuration according to the invention that makes it possible to achieve the amplification factor of 1, with a symmetrically constructed sample and hold amplifier AHV. The sample and hold amplifier AHV is formed of a first transistor T1a, a second transistor T1b, a third transistor T2a and a fourth transistor T2b. The collector of the first transistor T1a and the collector of the third transistor T2a are interconnected to form a first output terminal Aa. The collector of the second transistor T1b and the collector of the fourth transistor T2b are interconnected to form a second output terminal Ab. The first output terminal Aa is connected through a first collector resistor RCa to a first supply potential $V_{CC}$, and the second output terminal Ab is similarly connected to the first supply potential $V_{CC}$ through a second collector resistor RCb. The first output terminal Aa is connected to the control terminal or input of the fourth transistor T2b and the second output terminal Ab is connected to the control terminal or input of the third transistor T2a. The control terminal or input of the first transistor T1a forms a first input terminal Ea of the sample and hold circuit configuration and the control terminal or input of the second transistor T1b forms a second input terminal Eb of the sample and hold circuit configuration. The two input terminals Ea, Eb can be acted upon by a differential signal.

The first and second output terminals Aa, Ab are connected to one another through a hold capacitor Ch. The emitters of the first and second transistors T1a, T1b are connected to one another through at least one other resistor REa, REb and the emitters of the third and fourth transistors T2a, T2b are connected to one another through at least one further resistor REc, REd. The emitter circuit of the first transistor T1a and the emitter circuit of the second transistor T1b are connected in common to the collector terminal of a fifth transistor TS. The emitter circuit of the third transistor T2a and the emitter circuit of the fourth transistor T2b are connected in common to the collector terminal of a sixth transistor TH. The emitter terminal of the fifth transistor TS and the emitter terminal of the sixth transistor TH are connected in common through constant current impressing means Ik1 to a second supply potential $V_{EE}$. The control input ES of the fifth transistor TS and the control input EH of the sixth transistor TH are acted upon by a signal in such a manner that the fifth and sixth transistors TS, TH alternatingly conduct a current or block.

The circuit configuration of FIG. 7 differs from the circuit of FIG. 1, among other respects, in that the emitter terminal of the first transistor T1a is connected to the control or base terminal of a seventh transistor T3b and is connected through the resistor REa to the collector terminal of the fifth transistor TS. Furthermore, the emitter terminal of the second transistor T1b is connected to the control or base terminal of an eighth transistor T3a and is connected through the resistor REb to the collector terminal of the fifth transistor TS. Similarly, the emitter terminal of the third transistor T2a is connected to the control or base terminal of a ninth transistor T4a and is connected through the resistor REc to the collector terminal of the sixth transistor TH. Additionally, the emitter terminal of the fourth transistor T2b is connected to the control or base terminal of a tenth transistor T4b and is connected through the resistor REd to the collector terminal of the sixth transistor TH. The emitter terminals of the seventh and eighth transistors T3b, T3a are each connected through a respective added resistor REg, REf to the collector terminal of an eleventh transistor TS1 and the emitter terminals of the ninth and tenth transistors T4a, T4b are each connected through a respective additional resistor REi, REk to the collector terminal of a twelfth transistor TH1. The collector terminals of the seventh, eighth, ninth and tenth transistor T3b, T3a, T4a, T4b are each connected through a respective supplemental resistor RCg, RCf, RCi, RCk to the first supply potential $V_{CC}$. The emitter terminals of the eleventh and twelfth transistors TS1, TH1 are connected in common through further constant current impressing means Ik2 to the second supply potential $V_{EE}$. The control terminal or input of the eleventh transistor TS1 is connected to the control input of the fifth transistor TS, and the control input of the twelfth transistor TH1 is connected to the control input of the sixth transistor TH.

One first diode Da, Db is connected in the conducting direction in series with each respective first and second collector resistor RCa, RCb between the first supply potential $V_{CC}$ and each respective output terminal Aa, Ab. A second diode Dg, Df, Di, Dk is connected in the conducting direction between the first supply potential $V_{CC}$ and the collector terminal of each respective one of the seventh, eighth, ninth and tenth transistors T3b, T3a, T4a and T4b.

The basic mode of operation of a sample and hold circuit configuration according to the invention having a compensated amplifier will be described below with reference to the wiring of the first transistor T1a. The second, third and fourth transistors T1b, T2a and T2b are analogously linearized with the aid of the sixth, seventh and eighth transistors T3b, T4a and T4b with their corresponding wiring.

The base current that is supplied to the first transistor T1a is dissipated again by the seventh transistor T3b. As a result, the same current flows in both the collector resistor RCa and the emitter resistor REa. The voltage through the base-to-emitter diode of the first transistor T1a in the emitter circuit can be compensated for by the first diode Da in the collector circuit.

It is recommended that the transistors serving the purpose of current and voltage compensation, including their emitter and collector circuit wiring, having elements T3a, REf, RCf, T3b, REg, RCg, T4a, REi, RCi and T4b, REk, RCk and optionally Dg, Df, Di and Dk, be given an identical structure to the transistors of the actual sample and hold amplifier being formed of elements T1a, REa, RCa, T1b, RCb, REb, T2a, REc and T2b, REd and optionally Da and Db. Moreover, the two constant current impressing means Ik1 and Ik2 should be as identical as possible. The circuit according to the invention as described is in the sampling phase whenever the fifth transistor TS is conducting, or in other words when a higher potential is applied to the control input ES of the fifth transistor than to the control input EH of the sixth transistor TH. In that case the differential signal that is applied between the input terminal Ea at the control input of the first transistor T1a and the input terminal Eb at the control input of the second transistor T1b is connected to the output terminals Aa and Ab and stored in memory through the hold capacitor Ch. If a higher potential is present at the control input of the sixth transistor TH than at the control input of the fifth transistor TS, then the fifth transistor TS blocks, and the current impressing means Ik1 is toggled over to the second, third, ninth and tenth transistors T2a, T2b, T4a, T4b. In this case, the output signal held through the hold capacitor Ch is switched through the third and fourth transistors T2a and T2b to the output terminals Aa and Ab.

In monolithically integrated technology, diodes are typically made as suitably wired transistors. If the same current and voltage conditions are to be achieved in the emitter and collector circuits of an amplifier circuit according to the invention, than all the transistors used, including those connected as diodes, should be largely identical. If the diodes Da and Db are made as transistors having base and collector terminals which are short-circuited and connected to the first supply potential $V_{CC}$, then both the collector and the base current flow in the emitter of these transistors. Regardless of the switching position of the sample and hold amplifier, this base current can be dissipated again by a circuit configuration of the kind shown in FIG. 7. In such a circuit, one transistor is provided as each of the diodes Da, Db, Dg, Df, Di, Dk. The control inputs and the collectors of the transistors Da, Db, which are connected in series with the first and second collector resistors RCa, RCb, are connected together to the first supply potential $V_{CC}$. The control inputs of the transistors Df, Di, which are are respectively connected into the collector circuits of the eighth T3a and ninth T4a transistors, are connected to the emitter terminal of the transistor Db which is connected as a diode and is connected to the second collector resistor RCb. The control inputs of the transistors Dg, Dk, which are respectively connected into the collector circuits of the seventh T3b and tenth T4b transistors, are connected to the emitter terminal of the transistor Da which is wired as a diode and is connected to the first collector resistor RCa.

Since the output signal of the sample and hold amplifier in the hold phase is depended on the differential signal present between the output terminals Aa and Ab, a simultaneous drop in the signal level at both output terminals Aa and Ab by a predetermined direct voltage component has no influence on the signal.

Although only part of the total circuit has been described above, it is self-evident that because of the symmetrical layout, this description is equally applicable to the other half of the total circuit. Due to the symmetry, corresponding circuit elements are distinguished by the letters a and b after their reference numerals. A sample and hold circuit configuration of this kind according to the invention can be achieved not only with transistors of the most varied types, such as bipolar transistors, MOSFETs, MISFETs or MESFETSs, but also by various technologies, such as silicon, gallium arsenide and other technologies.

We claim:

1. Circuit configuration, comprising a symmetrically constructed sample and hold amplifier including first, second, third and fourth transistors each having a collector, a control terminal, an emitter and an emitter circuit, the collectors of said first and said third transistors being interconnected to form a first output terminal, the collectors of said second and said fourth transistors being interconnected to form a second output terminal, a first collector resistor connected between said first output terminal and a first supply potential, a second collector resistor connected between said second output terminal and the first supply potential, said first output terminal being connected to the control terminal of said fourth transistor, said second output terminal being connected to the control terminal of said third transistor, the control terminal of said first transistor forms a first input terminal of said sample and hold amplifier to be acted upon by a differential signal, the control terminal of said second transistor forms a second input terminal of said sample and hold amplifier to be acted upon by a differential signal, a hold capacitor connected between said first and second output terminals, a fifth transistor having a control terminal, an emitter and a collector, other resistors each being connected between the control terminal of said fifth transistor and the emitter circuit of a respective one of said first and second transistors, a sixth transistor having a control terminal, an emitter and a collector, further resistor each being connected between the control terminal of said sixth transistor and the emitter circuit of a respective one of said third and fourth transistors, constant current impressing means connected between the emitters of said fifth and sixth transistors and a second supply potential, the control terminals of said fifth and sixth transistors being acted upon by a signal causing said fifth and sixth transistors to alternatingly conduct current and block, a seventh transistor having a collector and an emitter and having a control terminal connected to the emitter of said first transistor, an eighth transistor having a collector and an emitter and having a control terminal connected to the emitter of said second transistor, a ninth transistor having a collector and an emitter and having a control terminal connected to the emitter of said third transistor, a tenth transistor having a collector and an emitter and having a control terminal connected to the emitter of said fourth transistor, eleventh and twelfth transistors each having a collector, an emitter and a control terminal, added resistors each being connected between the collector of said eleventh transistor and the emitter of a respective one of said seventh and eighth transistors, additional resistors each being connected between the collector of said twelfth transistor and the emitter of a respective one of said ninth and tenth transistors, further constant current impressing means connected between the emitters of said eleventh and twelfth transistors and the second supply potential, the control terminal of said eleventh transistor being connected to the control terminal of said fifth transistor, the control terminal of said twelfth transistor being connected to the control terminal of said sixth transistor, and supplemental resistors each being connected between the collectors of a respective one of said seventh, eighth, ninth and tenth transistors and the first supply potential.

2. Circuit configuration according to claim 1, including diodes connected in the conducting direction, each of said diodes being connected in series with a respective one of said first and second collector resistors between the first supply potential and a respective one of said output terminals.

3. Circuit configuration according to claim 1, including diodes each being connected in the conducting direction between the first supply potential and the collector of a respective one of said seventh, eighth, ninth and tenth transistors.

4. Circuit configuration according to claim 2, wherein said diodes are first diodes and including second diodes each being connected in the conducting direction between the first supply potential and the collector of a respective one of said seventh, eighth, ninth and tenth transistors.

5. Circuit configuration according to claim 4, wherein each of said diodes is a respective transistor having an emitter, a collector and a control terminal, the control terminal and the collector of each of said transistors of said first diodes being connected together to the first supply potential; the control terminals of said transistors of said second diodes connected to the collectors of said eighth and ninth transistors are connected to the emitter of said transistor of said first diode connected to said second collector resistor; and the control terminals of said transistors of said second diodes connected to the collectors of said seventh and tenth transistors are connected to the emitter of said transistor of said first diode connected to said first collector resistor.

* * * * *